(12) United States Patent
Atta et al.

(10) Patent No.: US 8,968,987 B2
(45) Date of Patent: Mar. 3, 2015

(54) IMPLEMENTING ENHANCED OPTICAL MIRROR COUPLING AND ALIGNMENT UTILIZING TWO-PHOTON RESIST

(75) Inventors: Emmanuel Atta, Rochester, MN (US); Darcy Berger, Rochester, MN (US); John R. Dangler, Rochester, MN (US); Matthew S. Doyle, Rochester, MN (US); Jesse Hefner, Rochester, MN (US); Thomas W. Liang, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 13/347,779

(22) Filed: Jan. 11, 2012

(65) Prior Publication Data
US 2013/0177697 A1 Jul. 11, 2013

(51) Int. Cl.
*G02B 6/26* (2006.01)
*B05D 5/06* (2006.01)
*G02B 6/34* (2006.01)

(52) U.S. Cl.
CPC .. *B05D 5/063* (2013.01); *G02B 6/34* (2013.01)
USPC ................ 430/321; 430/320; 385/31; 385/39

(58) Field of Classification Search
CPC ........ B05D 5/063; B05D 5/0067; B05D 3/06; B05C 11/00; B05C 9/12; G02B 6/26; G02B 6/34
See application file for complete search history.

(56) References Cited

U.S. PATENT DOCUMENTS

| | | | |
|---|---|---|---|
| 5,328,752 A * | 7/1994 | Miyazato | ...................... 428/209 |
| 5,468,595 A | 11/1995 | Livesay | |
| 6,235,450 B1 | 5/2001 | Nakasuji | |
| 6,343,172 B1 | 1/2002 | Schiestle et al. | |
| 6,808,957 B1 | 10/2004 | Ho et al. | |
| 7,205,668 B2 * | 4/2007 | Wu et al. | ...................... 257/774 |
| 7,589,880 B2 | 9/2009 | Kempa et al. | |
| 7,871,760 B2 | 1/2011 | Nottola et al. | |
| 8,249,402 B2 | 8/2012 | Asai et al. | |

(Continued)

FOREIGN PATENT DOCUMENTS

| | | | |
|---|---|---|---|
| JP | 02-177494 | * | 7/1990 |
| JP | 04-024987 | * | 1/1992 |

(Continued)

OTHER PUBLICATIONS

Satzinger et al. "Rapid prototyping of micro-optics . . ." Proc. SPIE vol. 6992 pp. 699217-1 to 699217-10 (2008).*

(Continued)

*Primary Examiner* — Martin Angebranndt
(74) *Attorney, Agent, or Firm* — Joan Pennington

(57) ABSTRACT

A method, system and computer program product for implementing an enhanced optical mirror coupling and alignment mechanism utilizing two-photon resist. An initial placement is provided for one or more vias on a printed circuit board. A via is filled with a resist. A series of tightly focused light beams suitably exposes the resist at varying depths in the via, the varying depths defining a sloped polymer in the via after removing resist that had not been at the focus of the light beam. The sloped polymer is coated with reflective material to reflect light into or out of the via.

6 Claims, 10 Drawing Sheets

(56) References Cited

U.S. PATENT DOCUMENTS

| | | | |
|---|---|---|---|
| 2005/0111781 A1* | 5/2005 | Jain et al. | 385/15 |
| 2005/0123862 A1* | 6/2005 | Pugliano et al. | 430/321 |
| 2006/0065640 A1* | 3/2006 | Lizotte et al. | 219/121.61 |
| 2007/0298601 A1 | 12/2007 | Booth et al. | |
| 2009/0310905 A1* | 12/2009 | Riester et al. | 385/14 |
| 2010/0104251 A1* | 4/2010 | Hodono et al. | 385/129 |
| 2011/0234421 A1 | 9/2011 | Smith | |
| 2012/0163752 A1* | 6/2012 | Kim et al. | 385/14 |
| 2012/0213470 A1* | 8/2012 | Matsuoka et al. | 385/14 |

FOREIGN PATENT DOCUMENTS

| | | | |
|---|---|---|---|
| JP | 6265738 | | 9/1994 |
| JP | 06-337320 | * | 12/1994 |
| JP | 2000-221347 | * | 8/2000 |
| JP | 2005164762 | | 6/2005 |
| JP | 2009069658 | | 8/2010 |
| WO | 2004/015463 | * | 2/2004 |

OTHER PUBLICATIONS

Passinger et al. "3D nanomanufacturing with femtosecond lasers and applications", Proc. SPIE vol. 6591 pp. 659104-1 to 659104-10 (2007).*

Williams et al., "Fabrication of three dimensional micro-photonic strcutures on th etip of optical fibers using SU-8", Opt. Expr. vol. 19(23) pp. 22910-22922 (Nov. 2011).*

Wu et al., "High numerical aperture microlens arrays fo close packing", Appl. Phys. Lett., vol. 97 pp. 03009-1 to 031109-3 (2010).*

Chen et al., "phase lenses and mirros created by laser nanofabrication via two-phton photopolymerization", Appl. Phys. Lett., vol. 97 pp. 171105-1 to 1701105-3 (2007).*

Machine translation of Jp 2005-164762.*

Malinauskas et al. "Femtosecond laser polymerization of hybrid/integrated micro-optical elements and their characterization", J. Opt., vol. 12 124010 (8 pages) (2010).*

* cited by examiner

IMPLEMENTING ENHANCED OPTICAL MIRROR COUPLING AND ALIGNMENT UTILIZING TWO-PHOTON RESIST

FIELD OF THE INVENTION

The present invention relates generally to the data processing field, and more particularly, relates to a method, system and computer program product for implementing an enhanced optical mirror coupling and alignment utilizing two-photon resist.

DESCRIPTION OF THE RELATED ART

As used in the following specification and claims, the term printed circuit board (PCB) should be broadly understood to include circuit cards, circuit boards, circuit wiring boards, and various other three-dimensional electronic packages including but not limited to first level packages.

Circuits fabricated on printed circuit boards frequently consist of multiple electrical traces distributed over multiple layers, or planes, of the printed circuit board (PCB). Electrical traces on different planes of the PCB may be electrically connected with a plated through hole, or plated via. A via is a hole in a PCB that may be plated with electrically conductive material on its sides so that two or more traces intersecting the via may be electrically connected. A via also is used to connect a trace to an electrical component mounted on the PCB.

Optical interfaces continue to be used in greater applications across the electronics industry. One of the difficult steps to utilize an optical interface is to align the optical channel from the driving IC package into the PCB, requiring a change from the vertical to horizontal plane. The processes by which this is presently accomplished include etching and mechanical ablation, both of which are relatively inaccurate, time consuming and expensive relative to conventional card manufacturing processes.

A need exists for an efficient and effective mechanism to implement an enhanced optical mirror coupling and alignment in a PCB.

SUMMARY OF THE INVENTION

Principal aspects of the present invention are to provide a method, system and computer program product for implementing an enhanced optical mirror coupling and alignment mechanism utilizing two-photon resist. Other important aspects of the present invention are to provide such method, system, and computer program product substantially without negative effects and that overcome many of the disadvantages of prior art arrangements.

In brief, a method, system and computer program product for implementing an enhanced optical mirror coupling and alignment mechanism utilizing two-photon resist. An initial placement is provided for one or more vias on a printed circuit board. A via is filled with a resist. A series of tightly focused light beams suitably exposes the resist at varying depths in the via, the varying depths defining a sloped polymer in the via after removing resist that had not been at the focus of the light beam. The sloped polymer is coated with reflective material to reflect light into or out of the via.

In accordance with features of the invention, enhanced alignment and optical mirror coupling are enabled using the via on the PCB. Advantages of using this process are that structures are efficiently and effectively made, and can be made optically transparent. The process yields an accurate optical mirror within a PCB, which includes other electronic package that is quickly repeatable from one PCB to the next and that maximizes optical power transfer.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing an enhanced optical mirror coupling and alignment mechanism utilizing two-photon resist. The invention effectively and efficiently provides an accurate optical mirror within a PCB.

Figure 1:
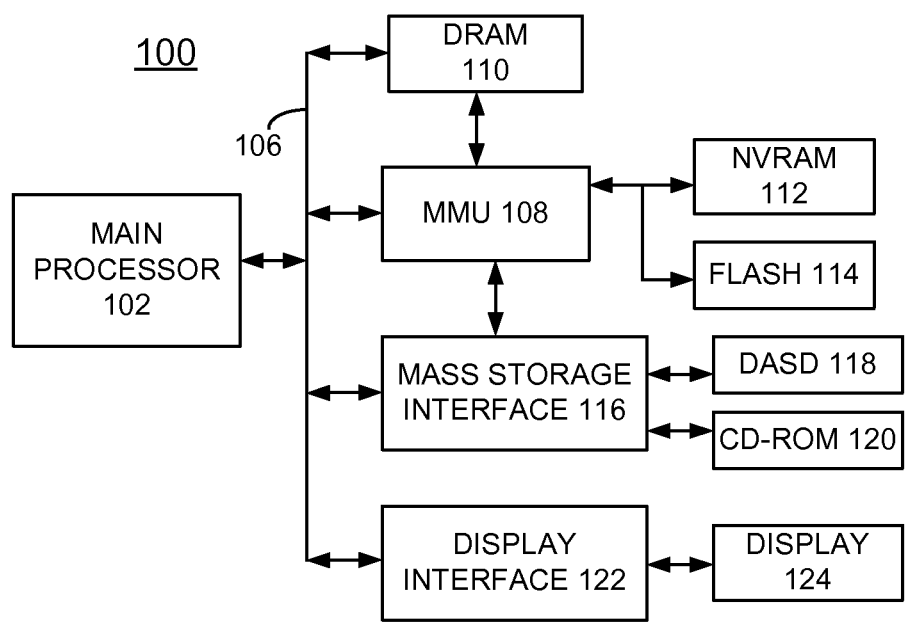
FIGS. 1, 2 and 3 are block diagram representations illustrating an example computer system and operating system for implementing an enhanced optical mirror coupling and alignment mechanism utilizing two-photon resist in accordance with the preferred embodiment.
Figure 2:
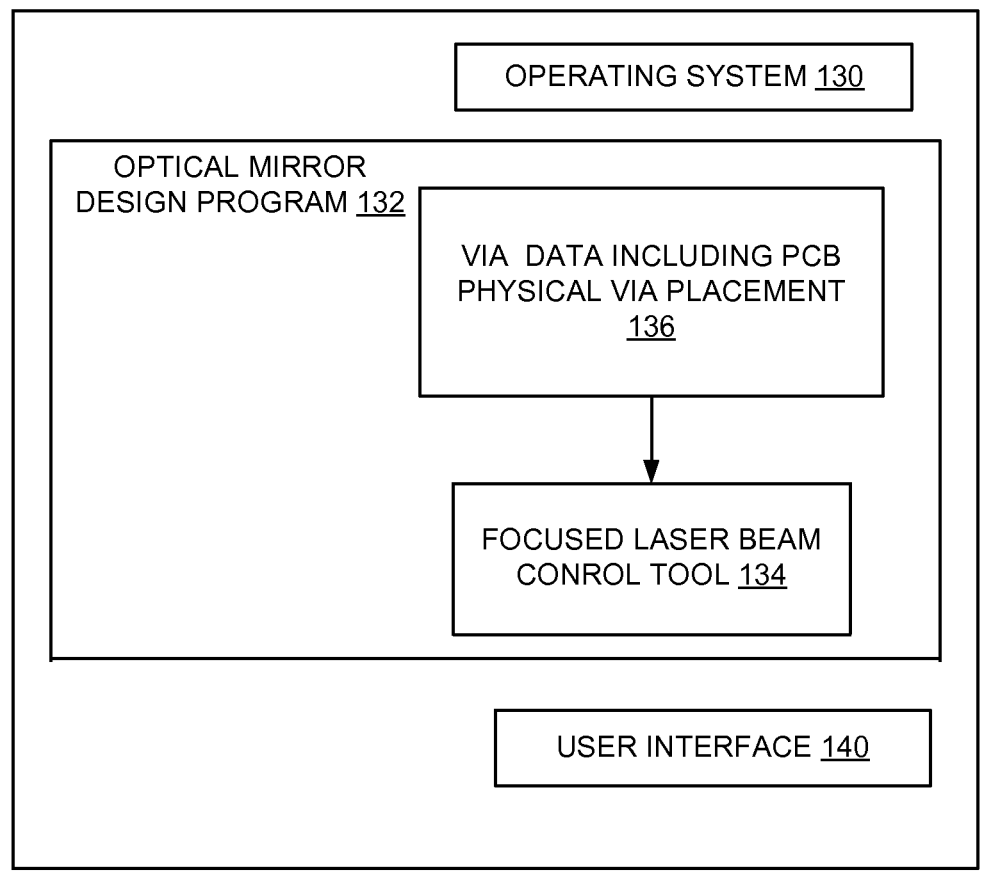
Figure 3:
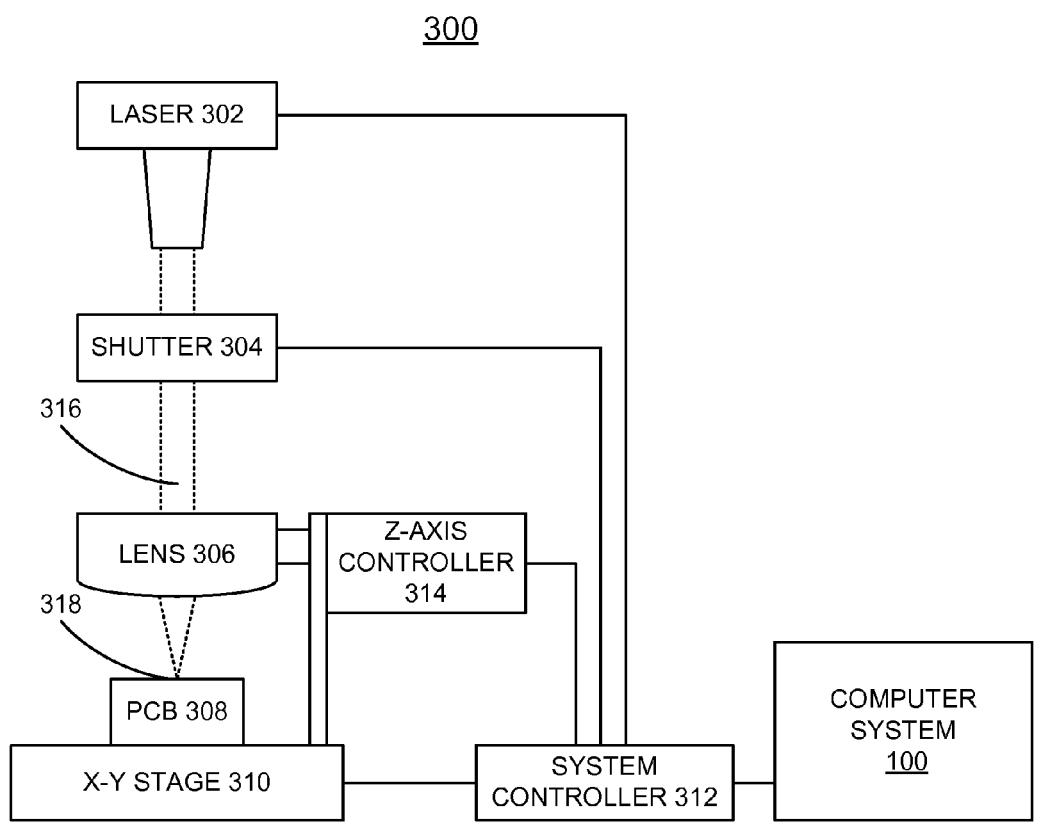

Referring now to the drawings, in FIGS. 1, 2, and 3 there is shown a computer system generally designated by the reference character 100 for implementing an enhanced optical mirror coupling and alignment mechanism utilizing two-photon resist in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

As shown in FIG. 2, computer system 100 includes an operating system 130, an optical mirror design program 132 including a focused laser beam control tool 134 of the preferred embodiment and via data including PCB physical via placement data 136 describing physical placement of one or more vias of the preferred embodiment, and a user interface 140.

As shown in FIG. 3, computer system 100 is used with an example laser positioning system generally designated by the reference character 300 including a focused light beam source or laser 302 providing a series of tightly focused light beams suitably exposes the resist at varying depths in the via through a shutter 304 and lens 306 to a PCB 308. The PCB 308 is carried by an X-Y positioning stage 310 operatively controlled by a system controller 312 and a Z-axis controller 314 coupled to the system controller 312. The system controller 312 is coupled to and operatively controls the laser 302 and the shutter 304.

It should be understood that various optical devices, including light filters, beam splitters, mirrors, and photodetectors, may be used to provide better control of the light source 202. For example, similar systems used for traditional lithography have achieved a resolution of 120 nanometers, while the present invention is not limited to a particular resolution.

Computer system 100 is shown in simplified form sufficient for understanding the present invention. The illustrated computer system 100 including the example laser positioning system 300 is not intended to imply architectural or functional limitations. The present invention can be used with various hardware implementations and systems and various other internal hardware devices, for example, multiple main processors.

In accordance with features of the invention, an optical mirror creation method includes an initial via placement is provided by via data 138 for one or more vias on a printed circuit board (PCB). A via is filled with a resist and a series of tightly focused light beams suitably exposes the resist at varying depths in the via using the focused laser beam control tool 134 with the varying depths defining a sloped polymer in the via after removing resist that had not been at the focus of the light beam. The sloped polymer is coated with reflective material to reflect light into or out of the via.

Various commercially available computers can be used for computer system 100. CPU 102 and system controller 312 is suitably programmed by the optical mirror design program 132 to execute the flowchart of FIG. 4 for implementing an enhanced optical mirror coupling and alignment mechanism utilizing two-photon resist in accordance with the preferred embodiment.

Figure 4:
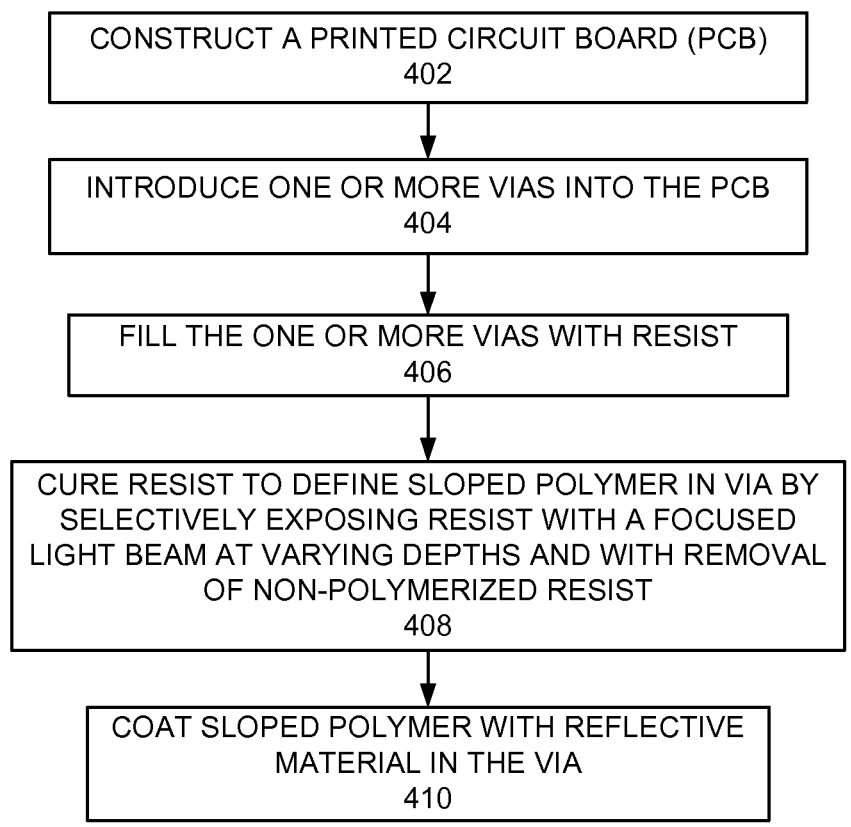
FIG. 4 is a flow chart illustrating example sequential steps for implementing an enhanced optical mirror coupling and alignment mechanism utilizing two-photon resist in accordance with the preferred embodiment.

Referring now to FIG. 4, there are shown exemplary sequential steps for implementing enhanced optical mirror coupling and alignment in accordance with the preferred embodiment. As indicated at a block 402 a PCB is constructed, and one or more vias are introduced into the PCB as indicated at a block 404. One or more vias are filled with a resist, such as a two-photon resist, as indicated at a block 406. The resist is cured or developed as indicated at a block 408. The resist is selectively exposed with a focused light beam at varying depths defining a sloped polymer in the via after removing resist that had not been at the focus of the light beam or non-polymerized resist at block 408. The sloped polymer is coated with reflective material to reflect light into or out of the via as indicated at a block 410.

Referring now to FIGS. 5, 6, 7, 8, and 9 there are shown example sequential steps or example operations for implementing optical mirror creation in accordance with the preferred embodiment.

Figure 5:
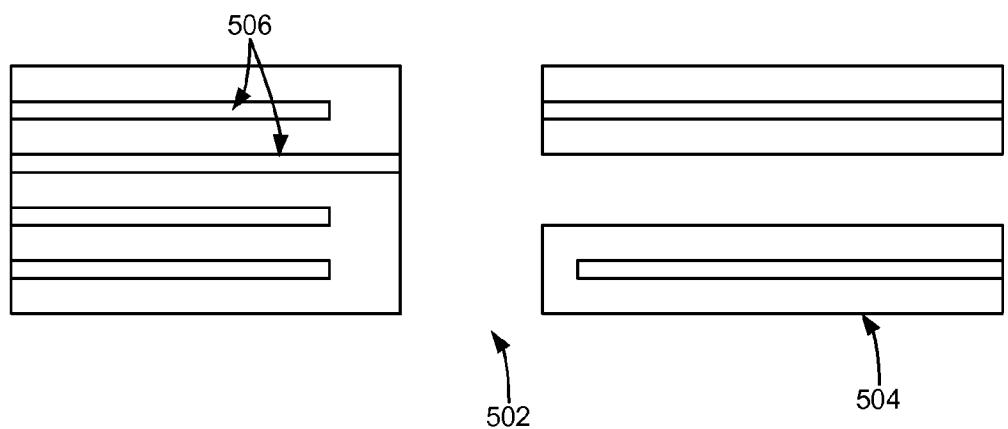
FIGS. 5, 6, 7, 8, and 9 schematically illustrates not to scale example sequential steps for implementing optical mirror creation in accordance with the preferred embodiment.

In FIG. 5, there is shown an example printed circuit board (PCB) generally designated by the reference character 500 for implementing optical mirror creation in accordance with the preferred embodiment.

FIG. 5 schematically illustrates not to scale an initial step with a via 502 formed through the PCB 500 for implementing optical mirror creation in accordance with the preferred embodiment. As shown, PBC 500 includes an insulator portion generally designated by the reference character 504 and a plurality of wiring planes generally designated by the reference character 506.

Figure 6:
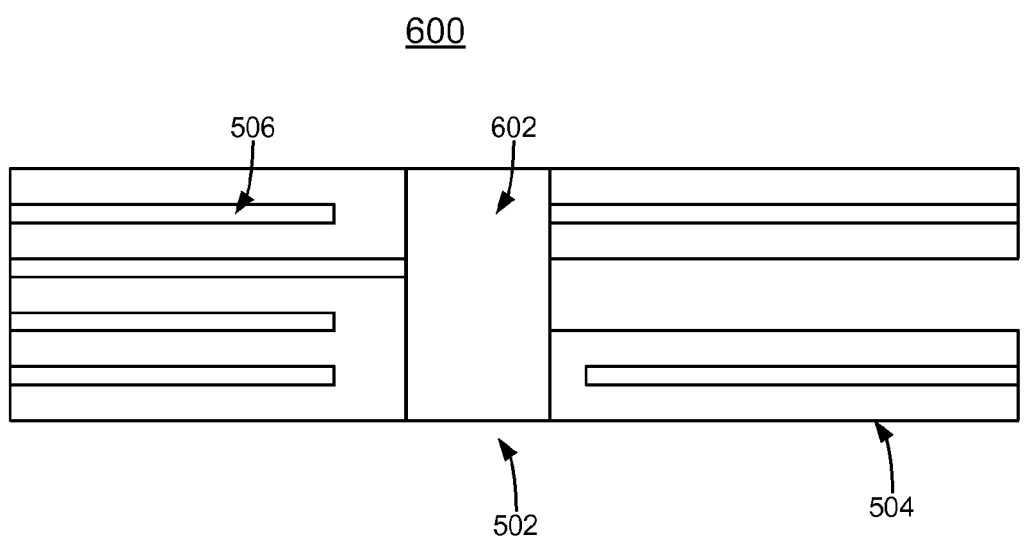

FIG. 6 schematically illustrates not to scale an example processing step generally designated by the reference character 600 with the via 502 filled with a resist 602. The resist 602 via is a photoresist which may be selectively polymerized at block 408 in FIG. 4 by a focused light beam. Selective polymerization may occur at a resolution necessary to form polymerized partitions, or other shapes, inside the via filled with photoresist 602. It should be understood that alternatively, the resist may not be a photoresist and the resist may be polymerized in a different manner.

In accordance with features of the invention, the photoresist 602 is capable of selective three-dimensional polymerization. The term, "selective three-dimensional polymerization" generally refers to the controlled polymerization of a targeted portion of a resist (a three-dimensional substance) disposed in a via 502 to the exclusion of the rest of the resist. An exemplary resist 602 capable of being selectively polymerized is a two-photon absorption (TPA) photoresist.

Figure 7:
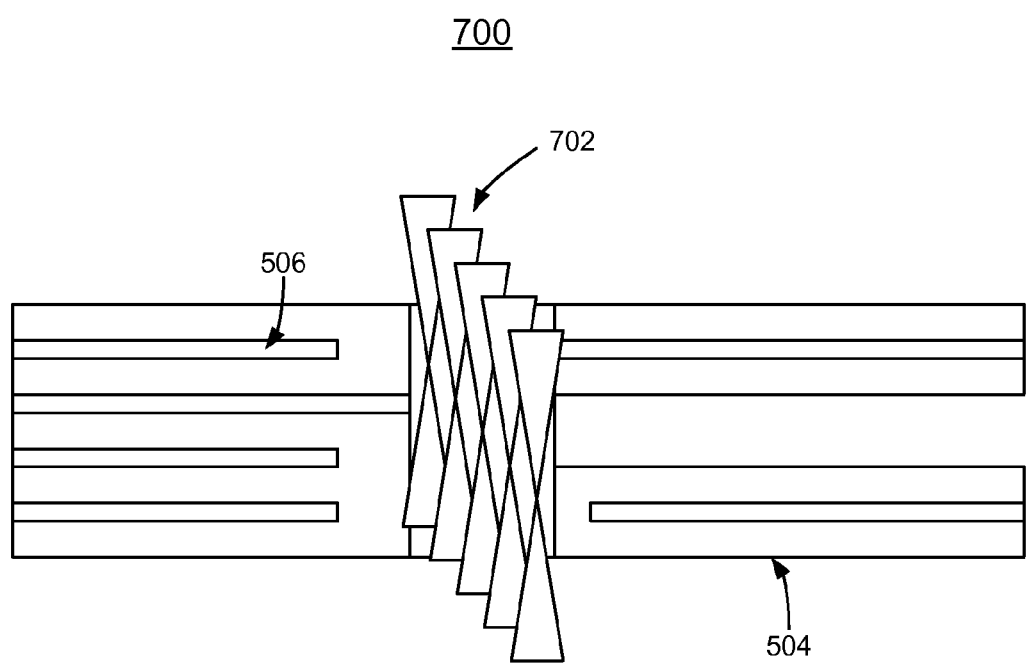

FIG. 7 schematically illustrates not to scale an example processing step generally designated by the reference character 700 where the resist is selectively exposed with a focused light beam at varying depths generally indicated by 702 for defining a sloped polymer in the via after removing resist that had not been at the focus of the light beam or non-polymerized resist. A tightly focused laser beam is scanned through the via 502 to expose the photoresist 602.

Figure 8:
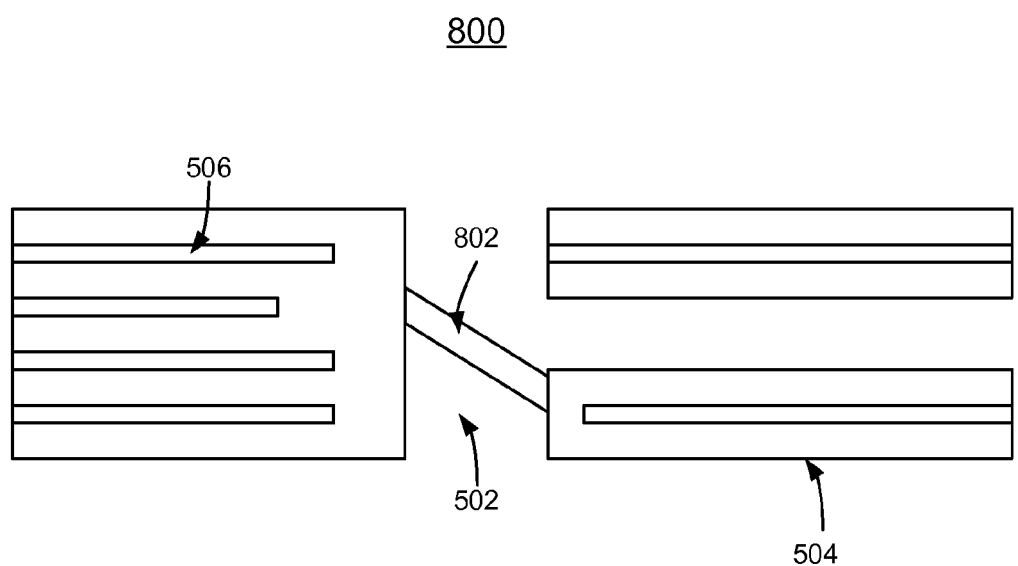

FIG. 8 schematically illustrates not to scale an example processing step generally designated by the reference character 800 where the resist is developed providing a sloped polymer 802 being defined in the via 502 after removing resist that had not been at the focus of the light beam or non-polymerized resist.

Figure 9:
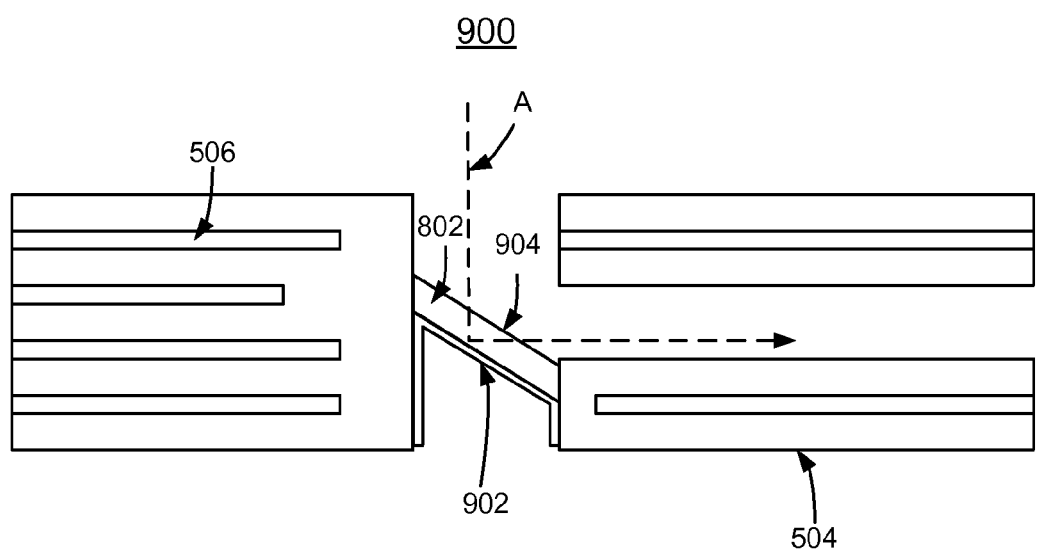

FIG. 9 schematically illustrates not to scale an example processing step generally designated by the reference character 900 where a reflective material 902 is deposited on one surface or side of the sloped polymer 802. The plated side 902 with the sloped polymer 802 that is transparent allows light to reflect off this plated side 902. An opposite side 904 is not plated, for example, so waveguide indicated by dotted line labeled A can be open.

This optical mirror creation method advantageously accommodates feedback from the PCB ECAT process and optical driver/receiver package manufacturing process such that slight changes in the PCB cross-section and planar alignment can be compensated by changing the focal point of the laser 302, thereby continually maximizing the power transfer of light energy.

Figure 10:
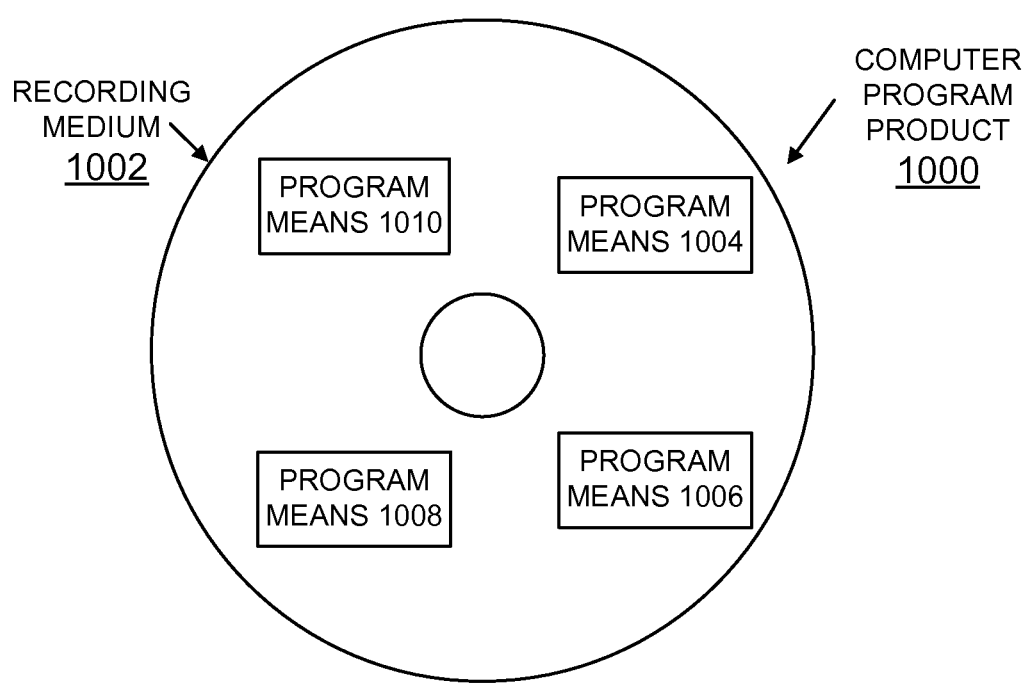
FIG. 10 is a block diagram illustrating a computer program product in accordance with the preferred embodiment.

Referring now to FIG. 10, an article of manufacture or a computer program product 1000 of the invention is illustrated. The computer program product 1000 includes a recording medium 1002, such as, a floppy disk, a high capacity read only memory in the form of an optically read compact disk or CD-ROM, a tape, or another similar computer program product. Recording medium 1002 stores program means 1004, 1006, 1008, 1010 on the medium 1002 for carrying out the methods for implementing optical mirror creation of the preferred embodiment in the system 100 of FIGS. 1, 2, and 3.

A sequence of program instructions or a logical assembly of one or more interrelated modules defined by the recorded program means 1004, 1006, 1008, 1010, direct the computer system 100 for implementing optical mirror creation of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing enhanced optical mirror coupling and alignment in a printed circuit board comprising:
   identifying an initial via placement for one or more vias in the printed circuit board;
   filling a via with a resist;
   using the via for providing enhanced optical mirror coupling and alignment in the printed circuit board by defining a sloped polymer bridge across the via by exposing the resist at varying depths in the via with a series of tightly focused light beams and removing the resist outside of the sloped polymer bridge defined by the exposure; and
   coating one side of the sloped polymer bridge with a reflective material and providing an opposite side of the sloped polymer without plating, allowing the reflection of light to or from a waveguide through the reflective material formed in the via.

2. The computer-implemented method as recited in claim 1 wherein filling a via with a resist includes filling said via with a two-photon absorption (TPA) photoresist.

3. The computer-implemented method as recited in claim 2 wherein defining a sloped polymer bridge across the via includes curing said two-photon absorption (TPA) photoresist with said series of tightly focused light beams to selectively polymerize the resist in the via.

4. The computer-implemented method as recited in claim 1 wherein exposing the resist at varying depths in the via with a series of tightly focused light beams includes applying a beam emitted from a laser.

5. The computer-implemented method as recited in claim 4 wherein applying a beam emitted from a laser includes scanning a tightly focused laser beam across the via exposing the resist.

6. The computer-implemented method as recited in claim 1 wherein coating one side of the sloped polymer bridge with a reflective material and providing an opposite side of the sloped polymer bridge without plating, allowing the reflection of light to or from a waveguide through the reflective material formed in the via includes plating one side of the sloped polymer bridge.

\* \* \* \* \*